(12) United States Patent
Moon et al.

(10) Patent No.: US 6,621,683 B1
(45) Date of Patent: Sep. 16, 2003

(54) MEMORY CELLS WITH IMPROVED RELIABILITY

(75) Inventors: Bum-ki Moon, Tokyo (JP); Andreas Hilliger, Kanagawa (JP); Nicolas Nagel, Kanagawa (JP); Gerhard Beitel, Kanagawa (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/065,127

(22) Filed: Sep. 19, 2002

(51) Int. Cl.[7] .............................................. H01G 4/228
(52) U.S. Cl. ................. 361/306.3; 361/303; 257/306; 439/239
(58) Field of Search ............................. 361/306.3, 303, 361/311–313, 321.2, 306.2; 29/25.41, 25.42; 257/301, 303, 306, 309; 438/240, 243, 239, 250

(56) References Cited

U.S. PATENT DOCUMENTS

| | | | | |
|---|---|---|---|---|
| 5,005,102 A | * | 4/1991 | Larson | 361/313 |
| 5,206,788 A | * | 4/1993 | Larson et al. | 361/313 |
| 5,369,296 A | * | 11/1994 | Kato | 257/295 |
| 5,475,248 A | * | 12/1995 | Takenaka | 257/295 |
| 5,495,117 A | * | 2/1996 | Larson | 257/295 |
| 5,963,466 A | * | 10/1999 | Evans, Jr. | 365/145 |
| 5,973,342 A | * | 10/1999 | Nakamura | 257/295 |
| 6,104,049 A | * | 8/2000 | Solayappan et al. | 257/295 |
| 6,171,871 B1 | * | 1/2001 | Machida et al. | 438/3 |

* cited by examiner

Primary Examiner—Anthony Dinkins
(74) Attorney, Agent, or Firm—Dexter Chin (57) ABSTRACT

A capacitor with improved reliability is disclosed. The capacitor includes a bottom electrode, a top electrode, and an intermediate layer therebetween. A contact, which is electrically coupled to the top electrode, is provided. At least a portion of the contact is offset from the capacitor. By offsetting the contact from the top electrode, the etch damage to the top electrode is reduced, thereby reducing or eliminating the need for the anneal to repair the etch damage.

32 Claims, 7 Drawing Sheets

MEMORY CELLS WITH IMPROVED RELIABILITY

BACKGROUND OF INVENTION

Figure 1:
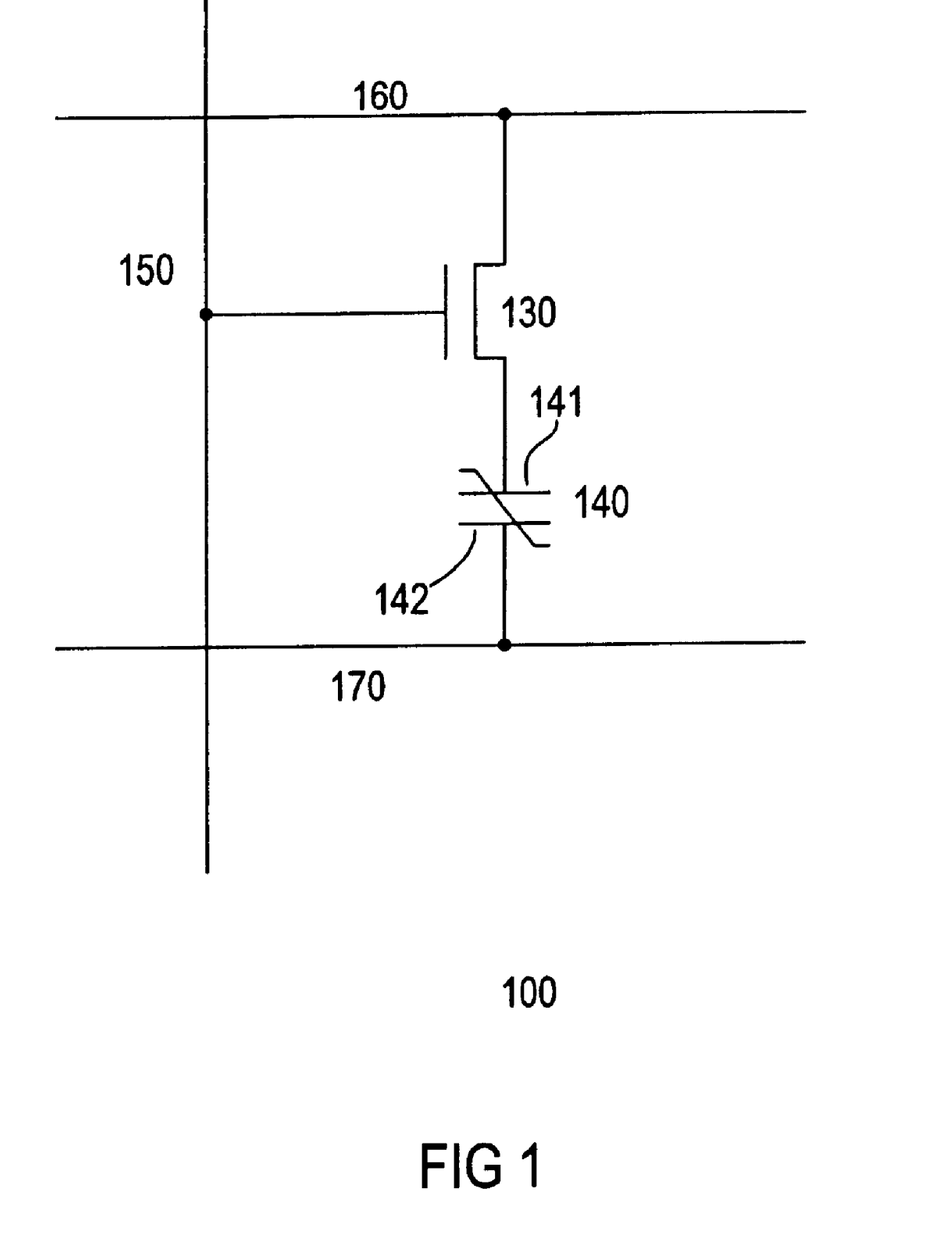
FIG. 1 shows a conventional ferroelectric memory cell.

Ferroelectric metal oxide ceramic materials such as lead zirconate titanate (PZT) have been investigated for use in ferroelectric semiconductor memory devices. Other ferroelectric materials, for example, strontium bismuth tantalum (SBT) can also be used. FIG. 1 shows a conventional ferroelectric memory cell 100 having a transistor 130 and a ferroelectric capacitor 140. An electrode 142 is coupled to a plateline 170 and another electrode 141 is coupled to the transistor which selectively couples or decouples the capacitor from a bitline 160, depending on the state (active or inactive) of a wordline 150 coupled to the transistor gate.

The ferroelectric memory stores information in the capacitor as remanent polarization. The logic value stored in the memory cell depends on the polarization of the ferroelectric capacitor. To change the polarization of the capacitor, a voltage which is greater than the switching voltage (coercive voltage) needs to be applied across its electrodes. An advantage of the ferroelectric capacitor is that it retains its polarization state after power is removed; resulting in a non-volatile memory cell.

Figure 2:
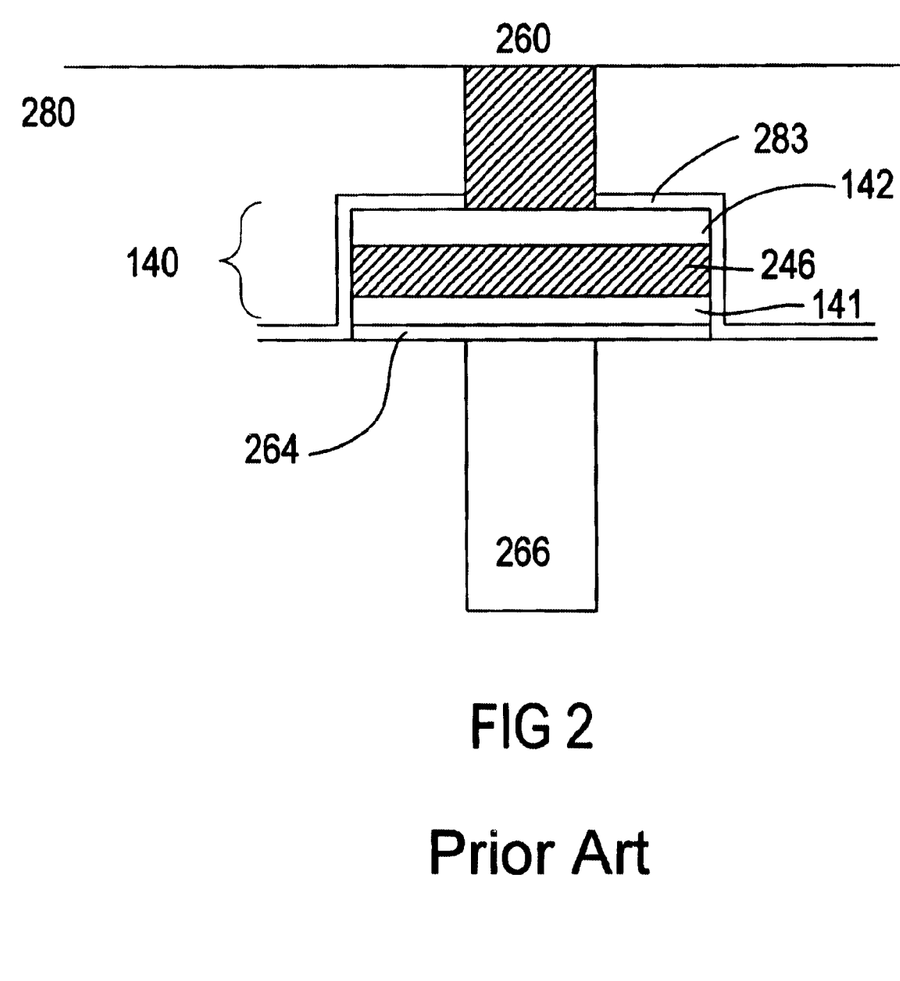
FIG. 2 shows a cross section of a conventional capacitor on plug structure.

FIG. 2 shows a cross section of a conventional ferroelectric capacitor 140 on a plug 266. As shown, the capacitor comprises a ferroelectric layer 246 sandwiched between first and second electrodes 141 and 142. The electrodes typically are formed from a noble metal such as platinum. The lower electrode 141 is coupled to the plug which, for example, is in contact with a diffusion region of the cell transistor. A barrier layer 264 can be provided below the lower electrode to protect the plug from oxidation. An encapsulation layer 283 surrounds the top and side of the capacitor, protecting the capacitor from diffusion of, for example, oxygen.

A contact opening 260 is formed in a dielectric layer 280, exposing the upper electrode. A contact is formed in the opening to couple the upper electrode to, for example, a plateline. The contact opening is formed by an anisotropic etch such as reactive ion etch (RIE). Etch damage to the upper electrode occurs during the formation of the contact opening. To repair the damage, a recovery anneal is necessary. However, the high temperature of the recovery anneal, typically about 500–700° C., oxidizes the plug. Oxidation increases contact resistance, thereby degrading the plug. Such degradation adversely impacts the reliability of the IC and reduces yields.

From the foregoing discussion, it is desirable to provide a ferroelectric memory IC with improved reliability and yields.

SUMMARY OF INVENTION

The invention relates to memory cells employed in ICs, such as memory ICs or other types of ICs. More particularly, the invention relates to improving the reliability of capacitors. In one embodiment a capacitor includes a bottom electrode, a top electrode, and an intermediate layer therebetween. A contact for coupling to the top electrode is provided. In one embodiment of the invention, at least a portion of the contact is offset from the capacitor. In one embodiment, the capacitor is a ferroelectric capacitor. Other types of capacitors are also useful. By offsetting the contract contact from the top electrode, the etch damage to the top electrode is reduced, thereby reducing or eliminating the need for the anneal to repair the etch damage.

DETAILED DESCRIPTION

Figure 3:
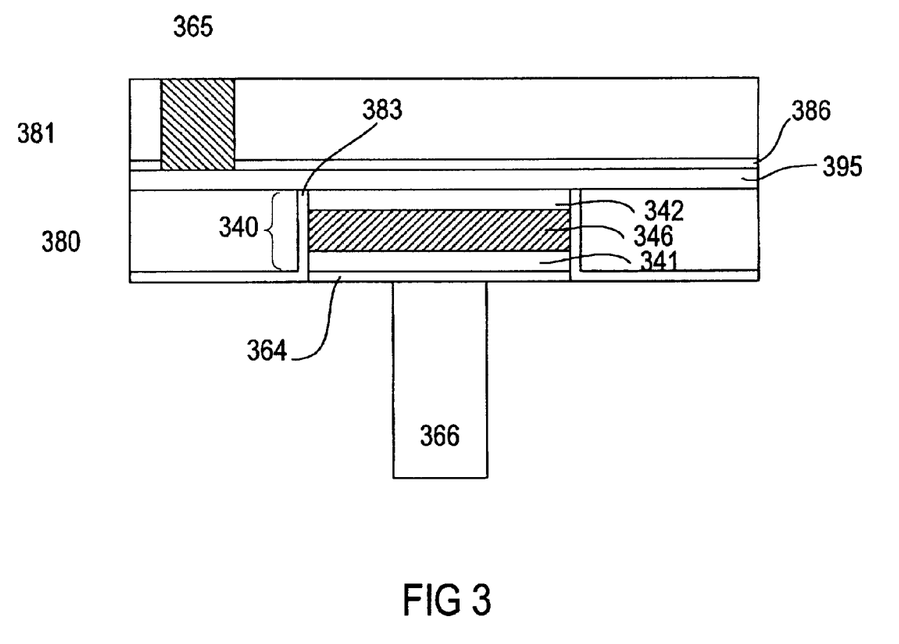
FIG. 3 shows a ferroelectric capacitor on plug with improved reliability in accordance with one embodiment of the invention.

The invention relates to improving reliability in memory cells. The memory cells, for example, are part of an IC, such as a memory IC. Other types of ICs are also useful. FIG. 3 shows one embodiment of the invention. As shown, a capacitor 340 includes an intermediate layer 346 between first and second electrodes 341 and 342. In one embodiment, the capacitor is a stack capacitor wherein the intermediate layer is between a bottom and a top electrode. The capacitor can be coupled to a transistor to form a memory cell. A plurality of memory cells are interconnected by wordlines and bitlines to form a memory array. The memory cells can be arranged in an open or a folded bitline architecture. Other types of architectures are also useful. For example, the memory cells can be arranged into groups, wherein the cells of a group are coupled in series. Such series architectures are described in, for example, Takashima et al., "High Density Chain Ferroelectric Random Access Memory (chain FRAM)", IEEE Jrnl. of Solid State Circuits, vol.33, pp.787–792, May 1998, which is herein incorporated by reference for all purposes.

In one embodiment, the capacitor is a ferroelectric capacitor in which the intermediate layer comprises a ferroelectric layer, such as PZT. Other types of ferroelectric materials, including SBT, are also useful. The electrodes can be formed from a noble metal, such as Pt, Ir, Pd, Ru, or alloys thereof. Other types of conductive materials, such as $SrRuO_3$, $La_{0.5}Sr_{0.5}O_3$, $LaNiO_3$, or $Yba_2Cu_3O_7$, are also useful. It is understood that the first and second electrodes need not be formed from the same material. Other types of conductive or intermediate layers are also useful to form other types of capacitors, such as those employed in dynamic random access memory (DRAM) cells. For example, intermediate layers, such as high k or other dielectric materials, can also be used.

The bottom electrode is coupled to a conductive plug 366. The conductive plug comprises, for example, tungsten or poly-Si. Other types of conductive materials can also be used. If the plug is poly-Si, a metal silicide layer can be provided over the plug. The metal silicide, for example, comprises titanium or cobalt. Other metal silicides are also useful.

In one embodiment, a barrier layer 364 is provided between the plug and the lower electrode to inhibit the diffusion of oxygen to the plug. The barrier layer, for example, comprises iridium. Other conductive barrier materials, such as $IrO_2$, Pd, Hf or Ru are also useful. An adhesion can be provided between the barrier layer and dielectric layer. The adhesion layer comprises, in one embodiment, titanium. Other types of adhesion promoting materials can also be used.

To protect capacitor form diffusion of oxygen, an encapsulation layer 383 can be provided on the sidewalls of the capacitor. The encapsulation layer, in one embodiment, comprises aluminum oxide ($Al_2O_3$) or silicon nitride ($Si_3N_4$). Other types of encapsulation materials which can serve as a barrier to oxygen are also useful.

In one embodiment, a third electrode 395 is provided above the top electrode. The second and third electrodes are electrically coupled. Preferably, the third electrode contacts the second electrode. In one embodiment, the third electrode comprises a conductive material such as a noble metal. Various types of noble metals, for example, Pt, Ir, Pd, Ru, or alloys thereof, are useful. Other types of conductive materials such as conductive oxides, for example, $SrRuO_3$, $La_{0.5}Sr_{0.5}O_3$, $LaNiO_3$, or $Yba_2Cu_3O_7$ are also useful. Preferably, the second and third electrodes are formed from the same material. It is, however, understood that the second and third electrodes need not be formed from the same material.

The third electrode, in one embodiment, extends at least beyond one side of the second electrode. The extension of the third electrode allows at least a portion of a contact 365 to be offset from the second electrode 342 of the capacitor (partially offset contact 365a). Preferably, the extension allows the contact to be completely offset from the second electrode of the capacitor. In another embodiment, the third electrode extends over the active area of the cell.

Optionally, an encapsulation layer 386 is provided above the third electrode. The encapsulation layer serves to protect the capacitor from the diffusion oxygen during annealing as well as diffusion of RIE process gases. In one embodiment, the encapsulation layer comprises $Al_2O_3$, or $Si3N_4$. Other materials which can prevent or reduce the diffusion of oxygen and etch process gases are also be useful.

As described, offsetting the contact from the top electrode eliminates etch damage thereto during contact formation. This advantageously eliminates the need for the recovery anneal to repair etch damage to the second electrode, thus resulting in improved reliability and yield.

The plug is, for example, coupled to a diffusion region of a memory cell transistor. The gate of the transistor serves or is the wordline. In one embodiment, the other diffusion region of the cell transistor is coupled to a bitline and the second electrode of the ferroelectric capacitor is coupled to a plateline. In alternative embodiments, such as in a series architecture, the second electrode is coupled to the other diffusion region of the cell transistor. For DRAM type cells, the other diffusion region is coupled to a bitline and the second electrode of the capacitor is coupled to a reference voltage.

In an alternative embodiment, the top electrode of the capacitor extends at least beyond one side of the capacitor (e.g., beyond the area of the ferroelectric layer). The extension of the second electrode allows at least a portion of a contact 365 to be offset from the capacitor. Preferably, the extension allows the contact to be completely offset from the capacitor. In another embodiment, the second electrode extends over the active area of the cell.

FIGS. 4–7 show a process for forming a capacitor structure 401 in accordance with one embodiment of the invention. As shown, a substrate 410 is provided. The substrate is prepared with the capacitor structure, which includes a capacitor 340 coupled to a plug 366. The COP structure can be formed by known techniques. Such techniques may include forming the plug in a dielectric layer 379. If the plug is poly-Si, a metal silicide layer can be formed over the plug prior to the capacitor layers. The metal silicide, for example comprises titanium or cobalt. Other metal suicides are also useful. The metal silicide can be formed by conventional techniques. The plug, for example, contacts a diffusion region of a transistor. After the plug is formed, first electrode 341, intermediate layer 346, and second electrode 342 are deposited on the surface of the dielectric layer and patterned to form the capacitor. The various layers can be patterned individually or together. For example, the bottom electrode can be patterned separately from the intermediate and top electrode layers. In one embodiment, the capacitor is a ferroelectric capacitor. For example, the electrode layers comprise Pt, Ir and/or $SrRuO_3$ while the ferroelectric layer comprises PZT. Other types of capacitors can also be formed using other types of materials, as known in the art.

Figure 4:
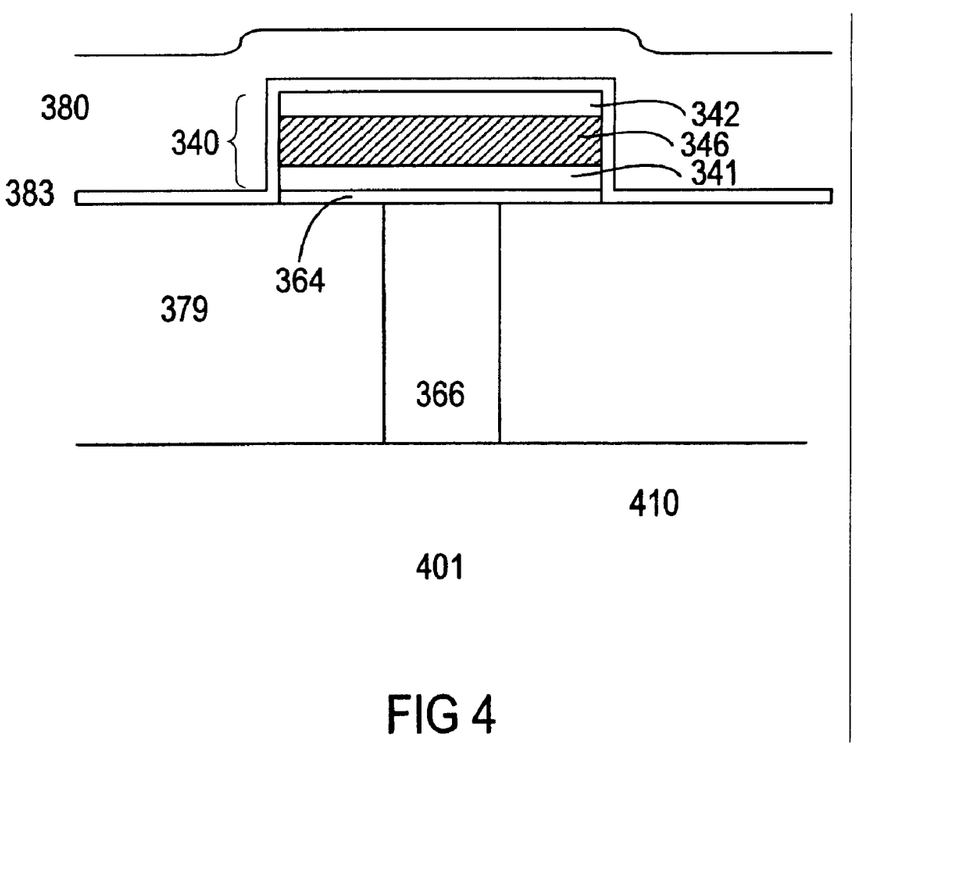
FIGS. 4–7 show a process for forming a capacitor on plug structure in accordance with one embodiment of the invention.

A barrier layer 364 may be provided between the first electrode and the plug. The barrier layer comprises, for example, Ir or $IrO_2$. Other materials, which can inhibit the diffusion oxygen can also be used. To promote adhesion between the barrier layer and dielectric layer, an adhesion layer can be provided beneath the barrier layer. The adhesion layer comprises, in one embodiment, titanium. Other types of adhesion promoting materials can also be used, including non-conductive materials. For non-conductive materials, the adhesion layer can remain on the ILD except wherein the plugs are located. Various techniques, for example PVD and CVD, can be used to form the barrier and adhesion layers.

After the capacitor is formed, an encapsulation layer 383 is deposited to encapsulate the capacitor. The encapsulation layer serves to protect the capacitor from diffusion of oxygen. In one embodiment, the encapsulation layer comprises $Al_2O_3$, which can be deposited by, for example, sputter or ALD (atomic layer deposition) or other conventional deposition techniques. Other types of materials, such as $Si_3N_4$, can also be used. A dielectric layer 380 is deposited over the substrate, covering the capacitor.

Figure 5:
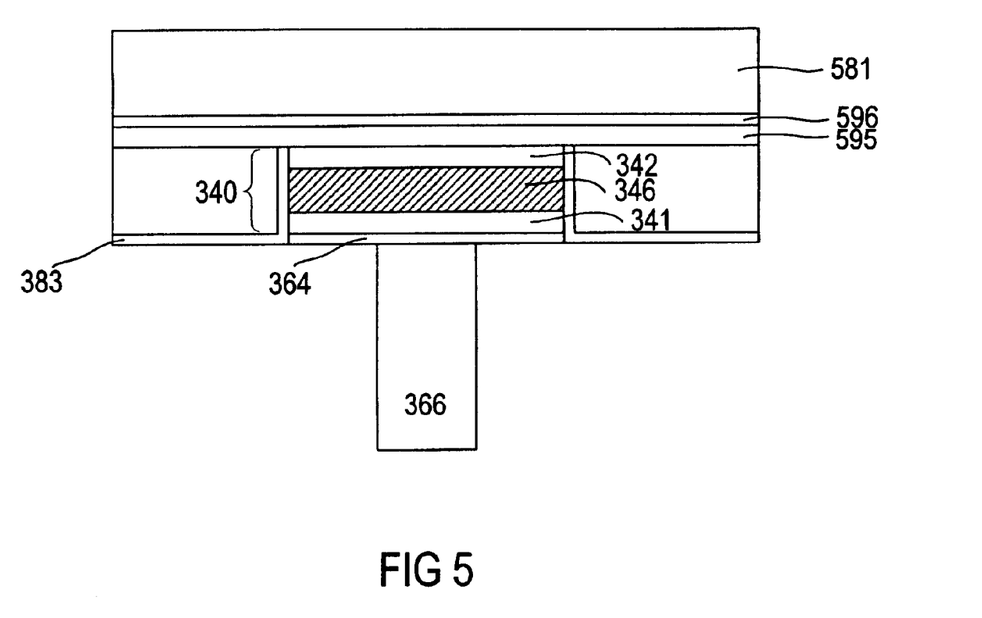

Referring to FIG. 5, excess portions of the dielectric layer 380 and the encapsulation layer above the capacitor are removed by, for example, chemical mechanical polishing (CMP). The CMP provides a planar surface with the dielectric layer and the second or upper capacitor electrode. A conductive layer 595 is deposited over the upper electrode. In one embodiment, the conductive layer is deposited by physical vapor deposition (PVD), such as sputtering. Other deposition techniques are also useful. The conductive layer, for example, comprises Pt, Ir, Pd, Ru or alloys thereof. Other types of conductive materials such as $SrRuO_3$, $La_{0.5}Sr_{0.5}O_3$, $LaNiO_3$, or $Yba_2Cu_3O_7$ are also useful.

An encapsulation layer 596 can be deposited over the conductive layer. Various techniques, such as PVD or ALD, can be used to form the encapsulation layer. The encapsulation layer protects the capacitor from diffusion of oxygen. The encapsulation layer comprises, for example, $Al_2O_3$. Other types of materials, such as $Si_3N_4$, can also be used. The conductive and encapsulation layers are patterned using conventional mask and etch techniques to form an upper electrode which extends at least on one side beyond the capacitor. A dielectric layer 581 is then deposited over the conductive or encapsulation layer.

Figure 6:
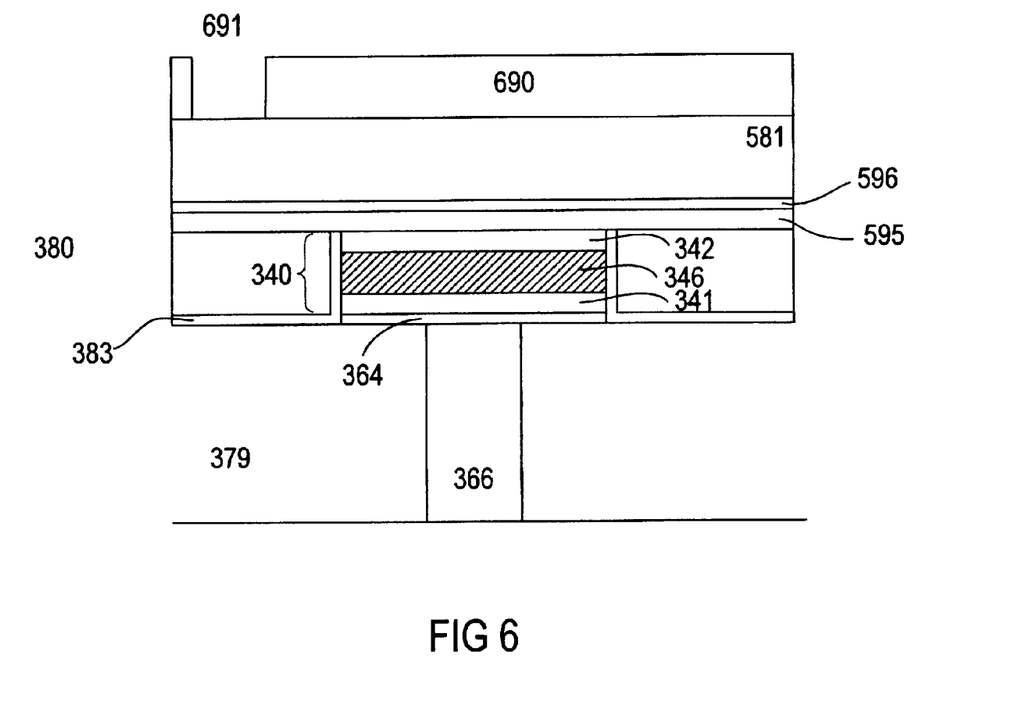
Figure 7:
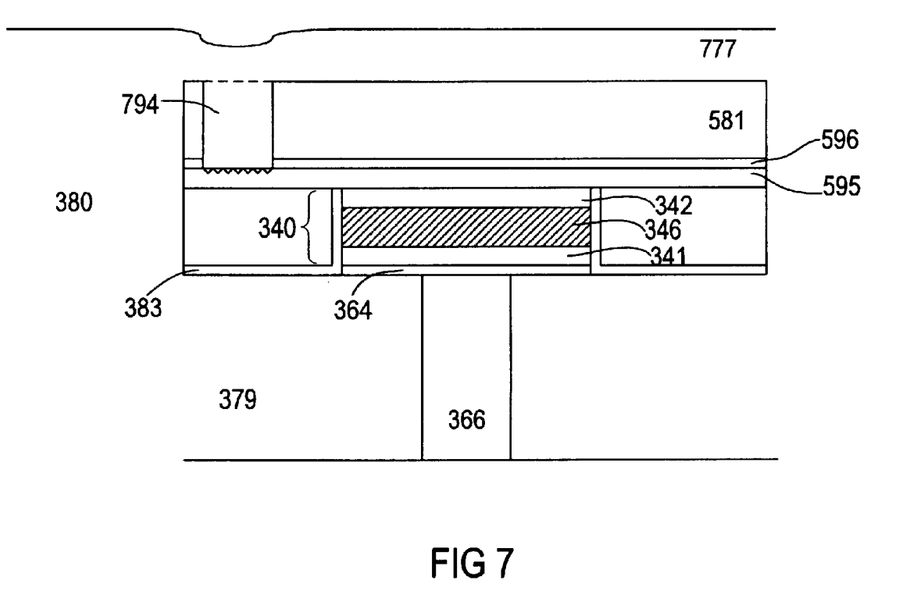

Referring to FIG. 6, a mask layer 690 is deposited over the dielectric layer. The mask layer, in one embodiment, comprises photoresist. The photoresist is selectively exposed and patterned to form opening 691, exposing a portion of the dielectric layer. Referring to FIG. 7, an anisotropic etch, such as RIE, is performed to create contact opening in dielectric layer 581. As shown, the contact opening is offset from the second electrode of the capacitor. A conductive material 777 is deposited on the substrate, filling the contact opening. Excess conductive material on the substrate surface is removed by, for example, CMP, thus creating a contact stud 794 (as indicated by the dotted line). The process continues, for example, to complete the memory cell. For example, the necessary interconnections to plateline and bitlines are formed.

In an alternative embodiment, a capacitor structure is prepared on the substrate. The capacitor structure is similar to that shown in FIG. 4 except that the second electrode is not formed. The process continues as described in FIGS. 4–7. As such, the capacitor's second electrode is extended beyond at least on one side of the capacitor.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A capacitor comprising:
   a bottom electrode;
   a top electrode;
   an dielectric intermediate layer between first and second electrode, the intermediate layer defining a capacitor area; and
   a contact for coupling to the top electrode, wherein at least a portion of the contact is offset from the capacitor area.

2. The capacitor of claim 1 wherein the capacitor is part of a memory cell.

3. The capacitor of claim 2 further comprises a plurality of memory cells interconnected by wordlines and bitlines to form a memory array.

4. The capacitor of claim 3 wherein the memory cells are arranged in an open bitline, folded bitline, or series architecture.

5. The capacitor of claim 2 further comprises a plurality of memory cells interconnected by wordlines and bitlines to form a memory array.

6. The capacitor of claim 1 wherein the intermediate layer comprises a ferroelectric material.

7. The capacitor of claim 6 wherein the top electrode extends beyond the capacitor to accommodate the offset of the contact.

8. The capacitor of claim 7 wherein the top electrode extends over an active area of the memory cell.

9. The capacitor of claim 7 wherein the top electrode extends beyond the capacitor area for the contact to completely be offset from the capacitor.

10. The capacitor of claim 9 wherein the top electrode extends over an active area of the memory cell.

11. The capacitor of claim 6 further comprises a third electrode electrically coupled to the top electrode, the third electrode extends beyond the capacitor area to accommodate the offset of the contact.

12. The capacitor of claim 11 wherein the third electrode extends beyond the capacitor area accommodate the offset of the contact.

13. The capacitor of claim 12 wherein the third electrode extends over an active area of the memory cell.

14. The capacitor of claim 11 wherein the third electrode extends beyond the capacitor area for the contact to completely be offset from the capacitor.

15. The capacitor of claim 14 wherein the third electrode extends over an active area of the memory cell.

16. The capacitor of claim 1 wherein the top electrode extends beyond the capacitor area to accommodate the offset of the contact.

17. The capacitor of claim 16 wherein the top electrode extends over all active area of the memory cell.

18. The capacitor of claim 16 wherein the top electrode extends beyond the capacitor area for the contact to completely be offset from the capacitor.

19. The capacitor of claim 17 wherein the top electrode extends over an active area of the memory cell.

20. The capacitor of claim 1 further comprises a third electrode electrically coupled to the top electrode, the third electrode extends beyond the capacitor to accommodate the offset of the contact.

21. The capacitor of claim 20 wherein the third electrode extends beyond the capacitor area to accommodate the offset of the contact.

22. The capacitor of claim 21 wherein the third electrode extends over an active area of the memory cell.

23. The capacitor of claim 20 wherein the third electrode extends beyond the capacitor area for the contact to completely be offset from the capacitor.

24. The capacitor of claim 23 wherein the third electrode extends over an active area of the memory cell.

25. A method of forming a capacitor comprising:
   providing a substrate prepared with a partially formed capacitor, the partially formed capacitor comprises a bottom electrode and an intermediate layer, the intermediate layer defining a capacitor area;
   depositing an extended electrode layer on the substrate surface;
   patterning the extended electrode layer on the substrate surface to form an extended electrode of the capacitor, the extended electrode extending at least beyond one side of the capacitor area;
   depositing a dielectric layer over the substrate, covering the substrate and extended electrode; and
   forming a contact coupling the extended electrode, wherein at least a portion of the contact is offset from the capacitor area.

26. The method of claim 25 wherein the capacitor comprises a ferroelectric capacitor.

27. The method of claim 26 further wherein the contact is completely offset from the capacitor area.

28. The method of claim 26 further comprises a top electrode disposed above the intermediate layer and below the extended electrode.

29. The method of claim 28 wherein the contact is completely offset from the capacitor area.

30. The method of claim 25 further comprises a top electrode disposed above the intermediate layer and below the extended electrode.

31. The method of claim 30 wherein the contact is completely offset from the capacitor area.

32. The method of claim 25 wherein the contact is completely offset from the capacitor area.

* * * * *

UNITED STATES PATENT AND TRADEMARK OFFICE
CERTIFICATE OF CORRECTION

| | | |
|---|---|---|
| PATENT NO. | : 6,621,683 B1 | Page 1 of 1 |
| APPLICATION NO. | : 10/065127 | |
| DATED | : September 16, 2003 | |
| INVENTOR(S) | : Bum-ki Moon et al. | |

It is certified that error appears in the above-identified patent and that said Letters Patent is hereby corrected as shown below:

In Column 1, Line 64 – "the contract contact" should read -- the contact --
In Column 3, Line 66 – "metal suicides" should read -- metal silicides --
In Claim 1, Column 5, Line 25 – "an dielectric" should read -- a dielectric --
In Claim 12, Column 5, Line 58 – "area accommodate" should read -- area to accommodate --
In Claim 17, Column 6, Line 8 – "all active" should read -- an active --

Signed and Sealed this

Fourteenth Day of November, 2006

JON W. DUDAS
*Director of the United States Patent and Trademark Office*